US006946871B1

(12) United States Patent
Kundu et al.

(10) Patent No.: US 6,946,871 B1
(45) Date of Patent: Sep. 20, 2005

(54) MULTI-LEVEL ROUTING ARCHITECTURE IN A FIELD PROGRAMMABLE GATE ARRAY HAVING TRANSMITTERS AND RECEIVERS

(75) Inventors: Arunangshu Kundu, San Jose, CA (US); Venkatesh Narayanan, San Jose, CA (US); John McCollum, Saratoga, CA (US); William C. Plants, Sunnyvale, CA (US)

(73) Assignee: Actel Corporation, Mountain View, CA (US)

(*) Notice: Subject to any disclaimer, the term of this patent is extended or adjusted under 35 U.S.C. 154(b) by 68 days.

(21) Appl. No.: 10/323,613

(22) Filed: Dec. 18, 2002

(51) Int. Cl.[7] ........................................ H03K 19/177
(52) U.S. Cl. ........................................ 326/41; 326/47
(58) Field of Search ........................ 326/37–41, 46–47, 326/101

(56) References Cited

U.S. PATENT DOCUMENTS

| | | | | |
|---|---|---|---|---|
| 4,255,748 | A | 3/1981 | Bartlett | 340/661 |
| 4,625,313 | A | 11/1986 | Springer | 371/20 |
| 4,638,187 | A | 1/1987 | Boler et al. | 307/451 |
| 4,638,243 | A | 1/1987 | Chan | 324/51 |
| 4,684,830 | A | 8/1987 | Tsui et al. | 307/465 |
| 4,700,130 | A | 10/1987 | Bloemen | 324/110 |
| 4,706,216 | A | 11/1987 | Carter | 365/94 |
| 4,713,557 | A | 12/1987 | Carter | 307/242 |
| 4,717,912 | A | 1/1988 | Harvey et al. | 340/825.83 |
| 4,718,042 | A | 1/1988 | Moll et al. | 365/201 |
| 4,742,252 | A | 5/1988 | Agrawal | 307/465 |
| 4,772,812 | A | 9/1988 | Desmarais | 307/473 |
| 4,800,176 | A | 1/1989 | Kakumu et al. | 437/193 |
| 4,857,774 | A | 8/1989 | El-Ayat et al. | 307/465 |
| 4,870,300 | A | 9/1989 | Nakaya et al. | 307/303 |
| 4,870,302 | A | 9/1989 | Freeman | 307/465 |
| 4,873,459 | A | 10/1989 | El Gamal et al. | 307/465 |
| 4,928,023 | A | 5/1990 | Marshall | 307/443 |
| 4,930,097 | A | 5/1990 | Ledenbach et al. | 364/716 |
| 4,935,645 | A | 6/1990 | Lee | 307/362 |
| 4,959,561 | A | 9/1990 | McDermott et al. | 307/443 |
| 4,978,905 | A | 12/1990 | Hoff et al. | 323/314 |
| 5,008,855 | A | 4/1991 | Eltoukhy et al. | 365/96 |
| 5,046,035 | A | 9/1991 | Jigour et al. | 364/716 |
| 5,083,083 | A | 1/1992 | El-Ayat et al. | 324/158 R |
| 5,121,394 | A | 6/1992 | Russell | 371/22.1 |
| 5,122,685 | A | 6/1992 | Chan et al. | 307/465.1 |

(Continued)

FOREIGN PATENT DOCUMENTS

EP 0 415 542 A2 3/1991 ........ H03K 19/173

(Continued)

OTHER PUBLICATIONS

L. Ashby, "ASIC Clock Distribution using a Phase Locked Loop (PLL)", *Proceedings Fourth Annual IEEE International ASIC Conference and Exhibit*, pp. 6.1-6.3, Sep. 1991.

(Continued)

*Primary Examiner*—James H. Cho
(74) *Attorney, Agent, or Firm*—Sierra Patent Group, Ltd.

(57) ABSTRACT

A routing architecture in a field programmable gate array (FPGA) having a plurality of logic clusters wherein each logic cluster has at least two sub-clusters. The logic clusters are arranged in rows and columns and each logic clusters has a plurality of receiver components, a plurality of transmitter components, at least one buffer module, at least one sequential logic component and at least one combinatorial logic component. A first-level routing architecture is programmably coupled to the logic clusters and a second-level routing architecture is programmably coupled to the logic clusters and to the first-level routing architecture through at least one of the transmitter components and at least one of the receiver components.

16 Claims, 10 Drawing Sheets

U.S. PATENT DOCUMENTS

| | | | | | |
|---|---|---|---|---|---|
| 5,126,282 | A | | 6/1992 | Chiang et al. | 437/172 |
| 5,132,571 | A | | 7/1992 | McCollum et al. | 307/465.1 |
| 5,144,166 | A | | 9/1992 | Camarota et al. | 307/465.1 |
| 5,187,392 | A | | 2/1993 | Allen | 307/465 |
| 5,198,705 | A | | 3/1993 | Galbraith et al. | 307/465 |
| 5,208,491 | A | | 5/1993 | Ebeling et al. | 307/465 |
| 5,220,213 | A | | 6/1993 | Chan et al. | 307/465 |
| 5,220,215 | A | | 6/1993 | Douglas et al. | 307/465 |
| 5,221,865 | A | | 6/1993 | Phillips et al. | 307/465 |
| 5,222,066 | A | | 6/1993 | Grula et al. | 371/21.1 |
| 5,258,319 | A | | 11/1993 | Inuishi et al. | 437/35 |
| 5,272,388 | A | | 12/1993 | Bakker | 307/202.1 |
| 5,286,922 | A | | 2/1994 | Curtiss | 174/112 |
| 5,293,133 | A | | 3/1994 | Birkner et al. | 324/713 |
| 5,300,830 | A | * | 4/1994 | Hawes | 326/41 |
| 5,300,832 | A | | 4/1994 | Rogers | 307/475 |
| 5,317,698 | A | | 5/1994 | Chan | 395/325 |
| 5,365,485 | A | | 11/1994 | Ward et al. | 365/221 |
| 5,367,207 | A | | 11/1994 | Goetting et al. | 307/465 |
| 5,375,089 | A | | 12/1994 | Lo | 365/189.04 |
| 5,381,058 | A | * | 1/1995 | Britton et al. | 326/41 |
| 5,394,033 | A | | 2/1995 | Tsui et al. | 326/41 |
| 5,394,034 | A | | 2/1995 | Becker et al. | 326/39 |
| 5,396,128 | A | | 3/1995 | Dunning et al. | 326/68 |
| 5,397,939 | A | | 3/1995 | Gordon et al. | 326/38 |
| 5,399,920 | A | | 3/1995 | Van Tran | 326/83 |
| 5,400,262 | A | | 3/1995 | Mohsen | 364/489 |
| 5,430,335 | A | | 7/1995 | Tanoi | 327/170 |
| 5,430,687 | A | | 7/1995 | Hung et al. | 365/230.08 |
| 5,469,003 | A | | 11/1995 | Kean | 326/39 |
| 5,469,396 | A | | 11/1995 | Eltoukhy | 365/210 |
| 5,473,268 | A | | 12/1995 | Declercq et al. | 326/80 |
| 5,485,103 | A | | 1/1996 | Pedersen et al. | 326/41 |
| 5,486,775 | A | | 1/1996 | Veenstra | 126/38 |
| 5,526,312 | A | | 6/1996 | Eltoukhy | 365/201 |
| 5,537,057 | A | | 7/1996 | Leong et al. | 326/41 |
| 5,546,019 | A | | 8/1996 | Liao | 326/81 |
| 5,559,464 | A | | 9/1996 | Orii et al. | 327/333 |
| 5,572,476 | A | | 11/1996 | Eltoukhy | 365/210 |
| 5,666,322 | A | | 9/1997 | Conkle | 365/233 |
| 5,670,905 | A | | 9/1997 | Keeth et al. | 327/333 |
| 5,744,979 | A | | 4/1998 | Goetting | 326/39 |
| 5,744,980 | A | | 4/1998 | McGowan et al. | 326/40 |
| 5,801,547 | A | | 9/1998 | Kean | 326/40 |
| 5,809,281 | A | | 9/1998 | Steele et al. | 395/497.01 |
| 5,815,003 | A | | 9/1998 | Pedersen | 326/39 |
| 5,815,004 | A | | 9/1998 | Trimberger et al. | 326/41 |
| 5,821,776 | A | | 10/1998 | McGowan | 326/41 |
| 5,825,200 | A | | 10/1998 | Kolze | 326/38 |
| 5,825,201 | A | | 10/1998 | Kolze | 326/39 |
| 5,825,202 | A | | 10/1998 | Tavana et al. | 326/39 |
| 5,825,662 | A | | 10/1998 | Trimberger | 364/491 |
| 5,828,230 | A | | 10/1998 | Young | 326/41 |
| 5,828,538 | A | | 10/1998 | Apland et al. | 361/56 |
| 5,831,448 | A | | 11/1998 | Kean | 326/41 |
| 5,832,892 | A | | 11/1998 | Yaoita | 123/260 |
| 5,835,165 | A | | 11/1998 | Keate et al. | 348/845.1 |
| 5,835,998 | A | | 11/1998 | Pedersen | 326/40 |
| 5,838,167 | A | | 11/1998 | Erickson et al. | 326/38 |
| 5,838,584 | A | | 11/1998 | Kazarian | 364/491 |
| 5,838,954 | A | | 11/1998 | Trimberger | 395/500 |
| 5,847,441 | A | | 12/1998 | Cutter et al. | 257/530 |
| 5,847,577 | A | | 12/1998 | Trimberger | 326/38 |
| 5,848,005 | A | | 12/1998 | Cliff et al. | 365/230.03 |
| 5,848,006 | A | | 12/1998 | Nagata | 365/230.06 |
| 5,850,151 | A | | 12/1998 | Cliff et al. | 326/39 |
| 5,850,152 | A | | 12/1998 | Cliff et al. | 326/40 |
| 5,850,564 | A | | 12/1998 | Ting et al. | 395/800.37 |
| 5,852,608 | A | | 12/1998 | Csoppenszky et al. | 370/465 |
| 5,854,763 | A | | 12/1998 | Gillingham et al. | 365/189.04 |
| 5,859,542 | A | | 1/1999 | Pedersen | 326/39 |
| 5,859,543 | A | | 1/1999 | Kolze | 326/41 |
| 5,859,544 | A | | 1/1999 | Norman | 326/40 |
| 5,861,761 | A | | 1/1999 | Kean | 326/41 |
| 5,869,981 | A | | 2/1999 | Agrawal et al. | 326/39 |
| 5,870,586 | A | | 2/1999 | Baxter | 395/500 |
| 5,880,492 | A | | 3/1999 | Duong et al. | 257/209 |
| 5,880,512 | A | | 3/1999 | Gordon et al. | 257/530 |
| 5,880,597 | A | | 3/1999 | Lee | 326/41 |
| 5,880,598 | A | | 3/1999 | Duong | 326/41 |
| 5,883,526 | A | | 3/1999 | Reddy et al. | 326/41 |
| 5,883,850 | A | | 3/1999 | Lee et al. | 365/230.03 |
| 5,949,719 | A | | 9/1999 | Clinton et al. | 365/189.01 |
| 5,952,847 | A | | 9/1999 | Plants et al. | 326/80 |
| 5,994,934 | A | | 11/1999 | Yoshimura et al. | 327/158 |
| 6,011,744 | A | | 1/2000 | Sample et al. | 365/230.03 |
| 6,034,677 | A | | 3/2000 | Noguchi et al. | 345/327 |
| 6,038,627 | A | | 3/2000 | Plants | 710/126 |
| 6,049,487 | A | | 4/2000 | Plants et al. | 365/189.04 |
| 6,107,827 | A | * | 8/2000 | Young et al. | 326/41 |
| 6,111,448 | A | | 8/2000 | Shibayama | 327/293 |
| 6,181,174 | B1 | | 1/2001 | Fujieda et al. | 327/158 |
| 6,289,068 | B1 | | 9/2001 | Hassoun et al. | 375/376 |
| 6,292,016 | B1 | | 9/2001 | Jefferson et al. | 326/39 |
| 6,329,839 | B1 | | 12/2001 | Pani et al. | 326/41 |
| 6,430,088 | B1 | | 8/2002 | Plants et al. | 365/189.04 |
| 6,437,650 | B1 | | 8/2002 | Sung et al. | 331/25 |
| 6,496,887 | B1 | | 12/2002 | Plants | 710/100 |

FOREIGN PATENT DOCUMENTS

| | | | |
|---|---|---|---|
| EP | 0 415 542 A3 | 10/1991 | H03K 19/173 |
| EP | 0 889 593 A1 | 1/1999 | H03K 19/173 |
| EP | 1 137 188 A2 | 9/2001 | H03L 7/08 |

OTHER PUBLICATIONS

"AV9170 Clock Synchronizer and Multiplier", pp. 1-4, 8 Nov. 1992.

"AV9170 Application Note", AvaSem, pp. 1-7, Jan. 1993.

U. Ko, "A 30-ps JITTER, 3.6-μs Locking, 3.3-Volt Digital PLL for CMOS Gate Arrays", *IEEE 1993 Custom Integrated Circuits Conference*, pp. 23.3.1-23.3.4, Conf. Date: May 9-12, 1993.

A. Efendovich et al., "Multi-Frequency Zero-Jitter Delay-Locked Loop", *IEEE 1993 Custom Integrated Circuits Conference*, pp. 27.1.1-27.1.4, Conf. Date: May-9-12, 1993.

R. Quinnell, "Blending gate arrays with dedicated circuits sweetens ASIC development", EDN, pp. 29-32, Mar. 31, 1994.

J. Chen, "PPL-based clock systems span the system spectrum from green PCs to Alpha", EDN, pp. 147-148, 150, 152, 154-155, Nov. 9, 1995.

P. Sevalia, "Straightforward techniques cut jitter in PLL-based clock drivers", EDN, pp. 119-123, 125, Nov. 23, 1995.

D. Bursky, "Memories Hit New Highs And Clocks Run Jitter-Free", Electronic Design, pp. 79-80, 84-85, 89-93, Feb. 19, 1996.

US 6,564,273, 05/2003, Plants (withdrawn)

* cited by examiner

MULTI-LEVEL ROUTING ARCHITECTURE IN A FIELD PROGRAMMABLE GATE ARRAY HAVING TRANSMITTERS AND RECEIVERS

BACKGROUND OF THE SYSTEM

1. Field of the System

The present system relates to field programmable gate array (FPGA) devices. More specifically, the system relates to a multi-level routing architecture having transmitters and receivers between logic modules in an FPGA that will increase the performance in the FPGA.

2. Background

FPGAs are known in the art. An FPGA comprises any number of logic modules, an interconnect routing architecture and programmable elements that may be programmed to selectively interconnect the logic modules to one another and to define the functions of the logic modules. An FPGA is an array of uncommitted gates with uncommitted wiring channels. To implement a particular circuit function, the circuit is mapped into an array and the wiring channels' appropriate connections are programmed to implement the necessary wiring connections that form the user circuit.

An FPGA circuit can be programmed to implement virtually any set of functions. Input signals are processed by the programmed circuit to produce the desired set of outputs. Such inputs flow from a user's system, through input buffers and through the circuit, and finally back out the user's system via output buffers. Such buffers provide any or all of the following input/output (I/O) functions: voltage gain, current gain, level translation, delay, signal isolation or hysteresis.

An FPGA core tile may be employed as a stand-alone FPGA, repeated in a rectangular array of core tiles, or included with other devices in a system-on-a-chip (SOC). The core FPGA tile may include an array of logic modules, and input/output modules. An FPGA core tile may also include other components such as read only memory (ROM) modules. Horizontal and vertical routing channels provide interconnections between the various components within an FPGA core tile. Programmable connections are provided by programmable elements between the routing resources.

The programmable elements in an FPGA can be either one-time programmable or re-programmable. Re-programmable elements used in FPGA technologies may comprise transistors or other re-programmable elements as is well known to those of ordinary skill in the art. One-time programmable elements used in FPGA technologies may comprise antifuse devices.

The interconnect routing architecture in a large FPGA that has long tracks may be cumbersome and slow due to the length of the tracks and the capacitive load of all the unprogrammed programmable elements on the tracks. The delay on the track is proportional to the square of the track length.

One method that has been used to circumvent the excessive track length problem is to insert repeaters (bi-directional buffers) at interim distances on the long-distance track. However, each of the repeaters needs at least two additional direction control signals that have to be selectively programmed to conform with the assigned net. The additional control signals add to the area, and therefore the cost, of the device and the complexity of the routing software.

Another method used to circumvent the excessive track length problem is to depopulate the tracks by reducing the number of programmable elements. This reduces the capacitive loading, (fewer programmable elements) and also reduces the connectivity of these tracks. However, this also reduces the flexibility of routing solutions and increases the chance of design failures.

Yet another method used to circumvent the excessive track length problem is to create a hierarchical routing architecture. In a hierarchical routing architecture, a signal has to transfer "up" the hierarchy, travel the distance, and then transfer "down" the hierarchy to reach its destination. In these types of architectures there are signal bottlenecks in the transfer-up points and the transfer-down points. It costs too much in terms of area on the die to provide full access between all lowest level resources and all the higher-level resources. The problem is usually managed by either providing very sparse access across hierarchies or introducing intermediate levels of hierarchy. Both solutions result in routing inflexibility and delay penalties.

Hence, there is a need in the art for a multi-level hierarchical routing architecture that provides full access between the lower-level resources and the higher-level resources at almost no additional cost.

SUMMARY OF THE SYSTEM

The presently disclosed system is an apparatus comprising a multi-level routing architecture having dedicated transmitters and receivers.

What is disclosed is a routing architecture in a field programmable gate array (FPGA) having a plurality of logic clusters wherein each logic cluster has at least two sub-clusters. The logic clusters are arranged in rows and columns and each logic cluster has a plurality of receiver components, a plurality of transmitter components, at least one buffer module, at least one sequential logic component and at least one combinatorial logic component. A first-level routing architecture is programmably coupled to the logic clusters and a second-level routing architecture is programmably coupled to the logic clusters and to the first-level routing architecture through at least one of the transmitter components and at least one of the receiver components.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE DRAWINGS

Those of ordinary skill in the art will realize that the following description of the present invention is illustrative only and not in any way limiting. Other embodiments of the invention will readily suggest themselves to such skilled persons.

Figure 1:
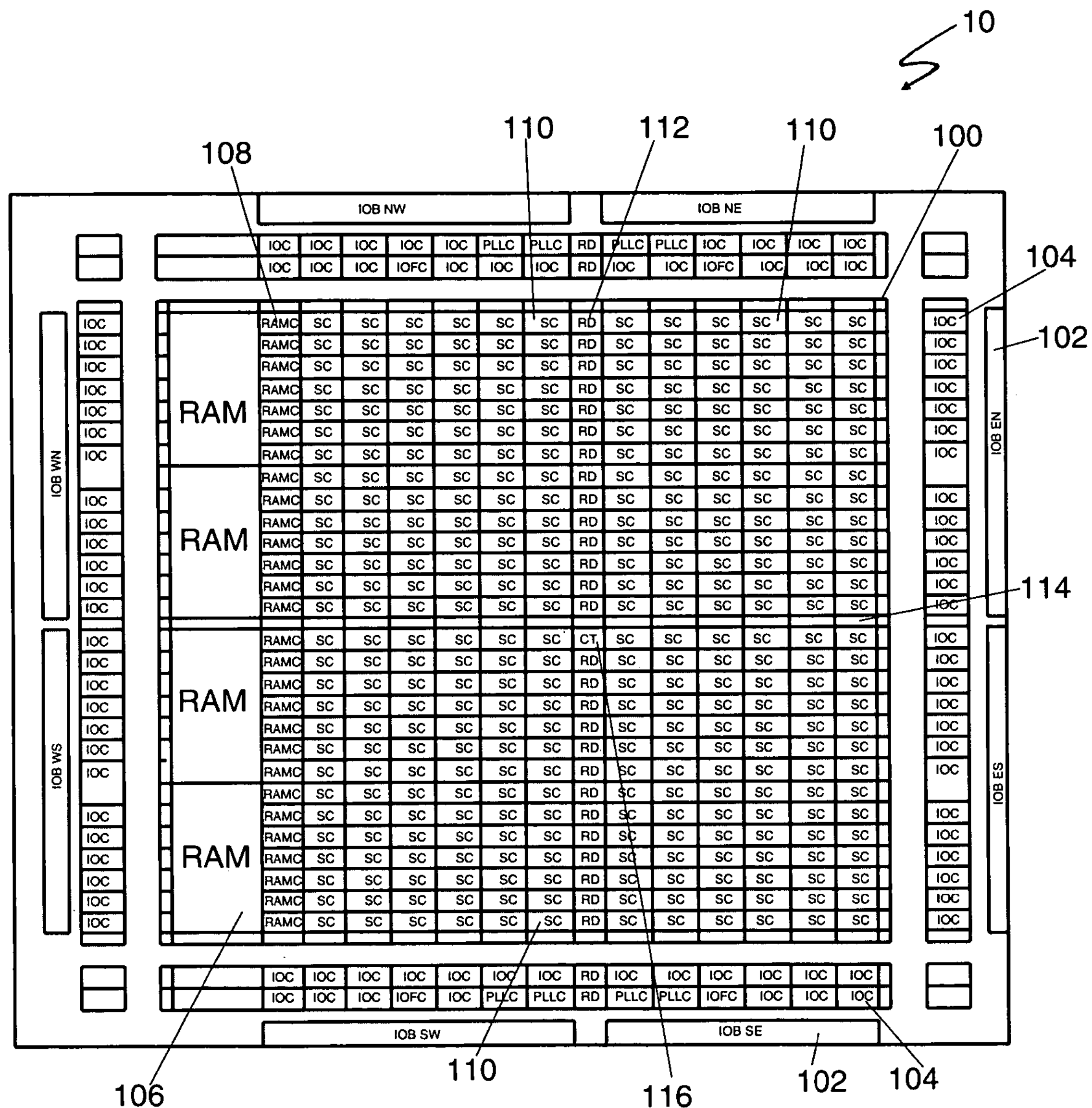
FIG. 1 is a simplified block diagram of an FPGA core tile incorporating the routing channel architecture having transmitters and receivers (not shown), as disclosed in the present system.

FIG. 1 is a simplified block diagram of an FPGA 10 having one core tile 100 incorporating routing channel architecture (not shown) having dedicated transmitters and receivers, as disclosed in the present system. As shown in FIG. 1, core tile 100 comprises an array of logic clusters 110, a column of routed clock clusters 112, a row of hard-wired clock clusters 114, a clock tile cluster 116, a row of RAM clusters 108, RAM memory 106. FPGA core tile 100 is surrounded by two rows of input/output (I/O) clusters 104 and I/O banks 102. In FIG. 1, edges of the device shown are referred to in terms of compass directions, for example, the top edge is designated the "north" side of the device. On the north and south edges surrounding FPGA core tile 100 there are eight phase-locked-loop clusters (PLL clusters) 120.

Figure 2:
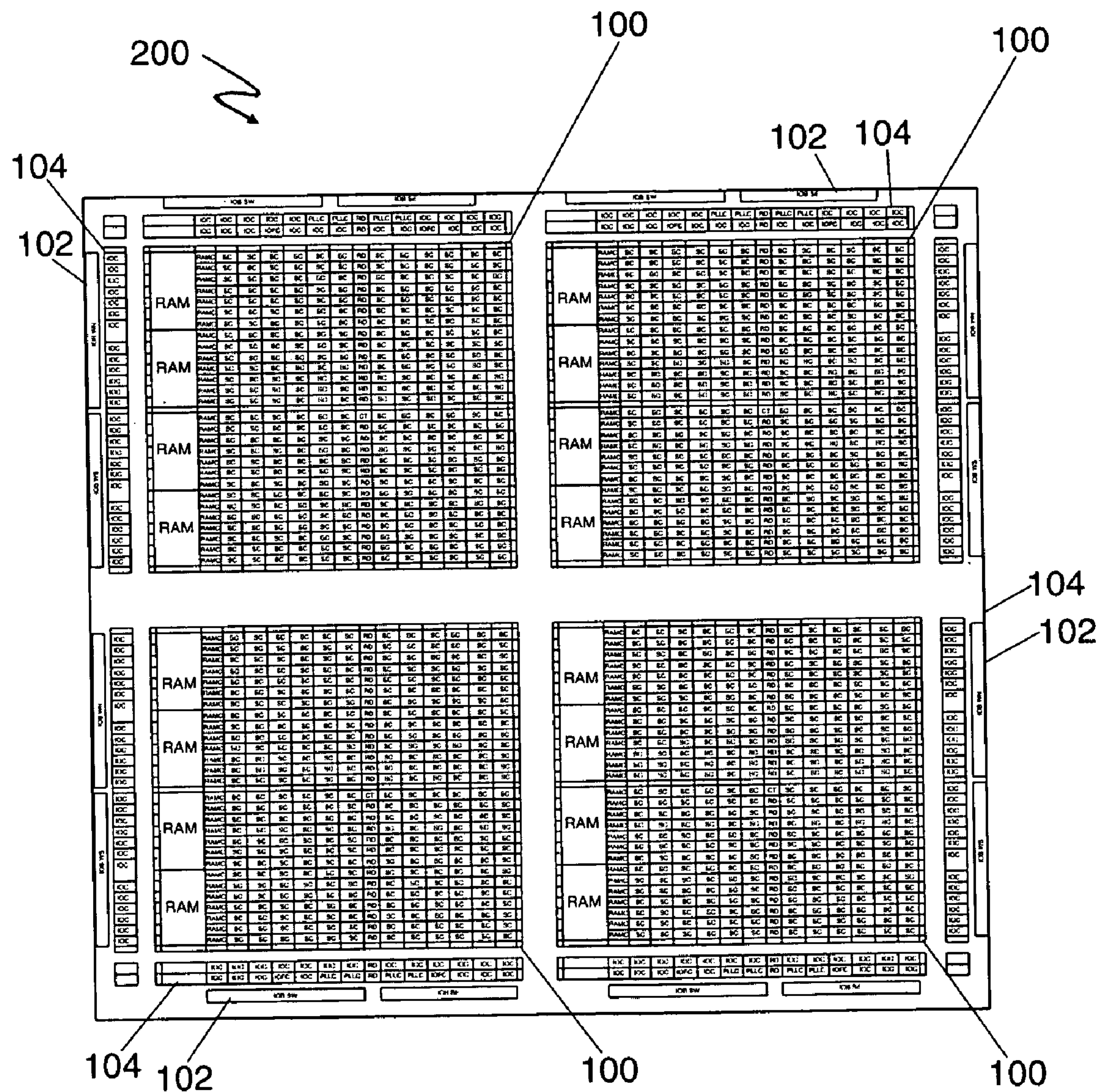
FIG. 2 is a block diagram of an illustrative FPGA including multiple core tiles 100 as shown in FIG. 1.

FIG. 2 is a block diagram of an illustrative FPGA 10 including multiple core tiles 100 as shown as an example in FIG. 1. As shown in FIG. 2, the FPGA device comprises four core tiles 100, though other numbers of tiles are possible. Core tiles 100 are surrounded by I/O clusters 104 and I/O banks 102.

Figure 3:
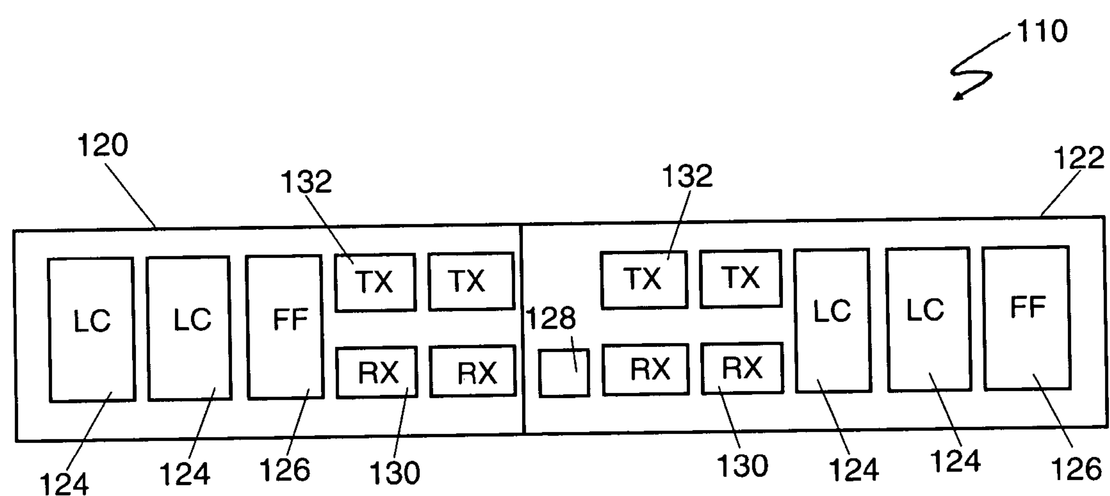
FIG. 3 is a simplified block diagram of a logic cluster of the present system as shown in FIG. 1.

FIG. 3 is a simplified block diagram of a logic module of the present system. Logic cluster 110 comprises two sub-clusters 120 and 122. Sub-clusters 120 and 122 each contain two logic components 124, a flip-flop 126, two receiver (RX) modules 130 and two transmitter (TX) modules 132. Logic cluster 110 also comprises a buffer module 128. Receiver modules 130 and transmitter modules 132 will be discussed in greater detail below.

To avoid overcomplicating the disclosure and thereby obscuring the present invention buffer module 128 is not described in detail herein. The implementation of buffer module 128 suitable for use according to the present system is disclosed in U.S. patent application Ser. No. 10/293,895, filed Nov. 12, 2002, by inventor William C. Plants, entitled "BUFFER MODULE AND A METHOD OF DISTRIBUTING BUFFER MODULES IN AN ANTIFUSE FPGA", and hereby incorporated herein by reference.

Figure 4:
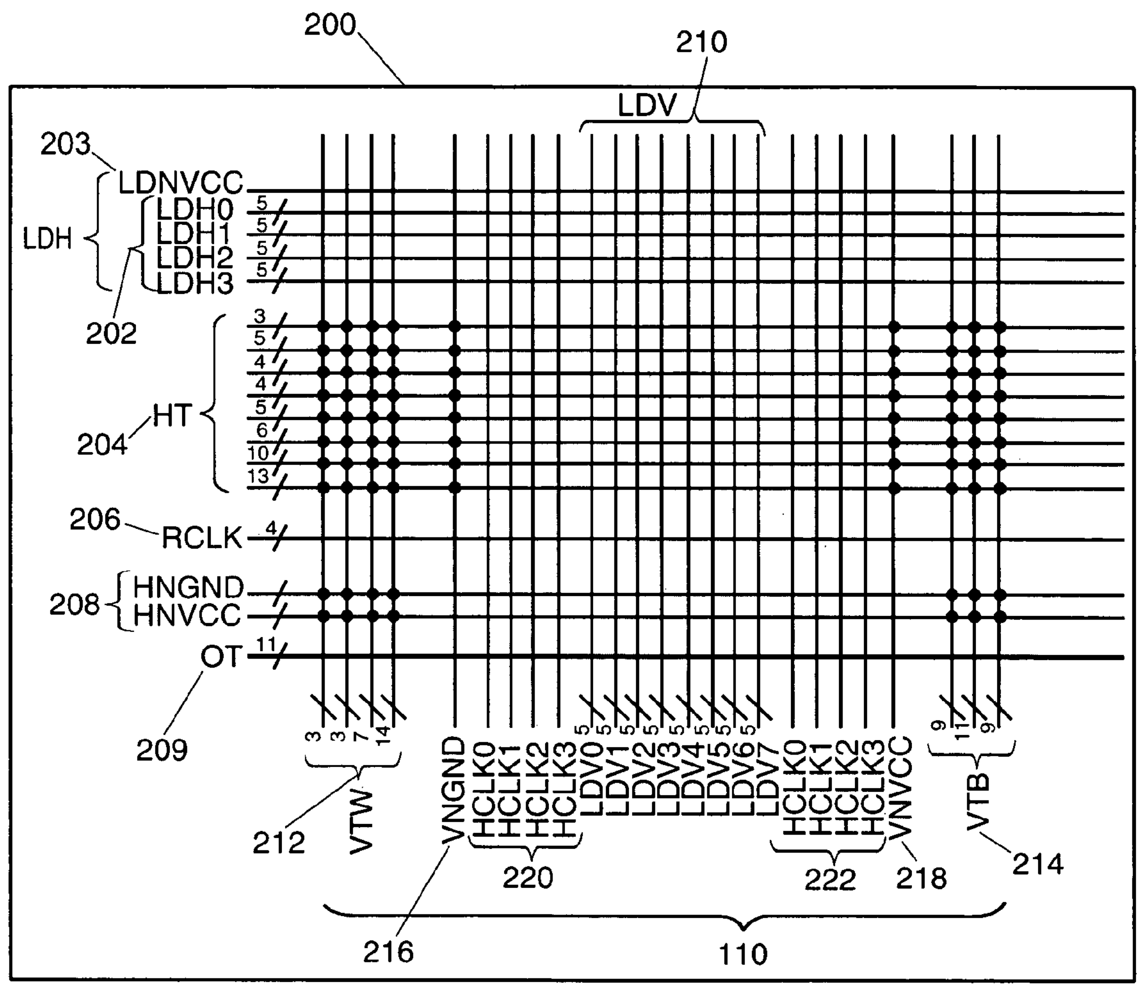
FIG. 4 is a simplified schematic diagram of the multilevel routing architecture of the present system through a logic cluster of FIG. 1.

FIG. 4 is a simplified schematic diagram of an embodiment of a multi-level routing architecture 200 of the present system through a logic cluster 110 of FIG. 1. Multi-level routing architecture 200 has multiple levels of routing architecture running over each row and column of logic clusters 110. In this illustrative example, there are two levels of routing architecture. In the horizontal routing channel through logic cluster 110, there are eight first-level horizontal channels 204 spanning each logic cluster 110. Individual first-level horizontal channels in first-level horizontal channels 204 have a varying number of tracks. In addition, there is an output routing channel 209, a set of horizontal tracks 208 coupled to ground and Vcc, wherein Vcc may be a programming or operating voltage, respectively, and a routed clock channel 206. The routed clock tracks 206 may drive the clock, preset and enable (not shown) pins of flip-flop 126 in logic cluster 110 as shown in FIG. 3.

Four second-level channels 202 cover each row of logic clusters 110 spanning the entire width of FPGA core 100 (as shown in FIG. 1). Each second-level routing channel 202 has five tracks. The second-level horizontal channels 202 contain a track coupled to Vcc 203 for tie-offs of unused buffer inputs (discussed in greater detail below).

In the vertical routing channel through logic cluster 110, there are two first-level horizontal channels, divided into a left, first-level vertical channel 212 and a right, first-level vertical channel 214, spanning each logic cluster 110. Left, first-level vertical channel 212 comprises four sets of tracks each having a varying number of tracks. Right, first-level vertical channel 214 comprises three sets of tracks each having a varying number of tracks. In addition, there is a set of vertical tracks 208 coupled to ground 216 and Vcc 218, and two hard-wired clock channels 220 and 222 respectively. In the embodiment shown in FIG. 4, the hard-wired clock tracks 220 and 222 are coupled to the clock pins in at least one flip-flop 126 in each logic cluster 110 as shown in FIG. 3. Eight second-level vertical channels 210 cover each column of logic clusters 110 spanning the entire width of FPGA core 100 (as shown in FIG. 1). Each second-level vertical routing channel 210 has five tracks.

Figure 5:
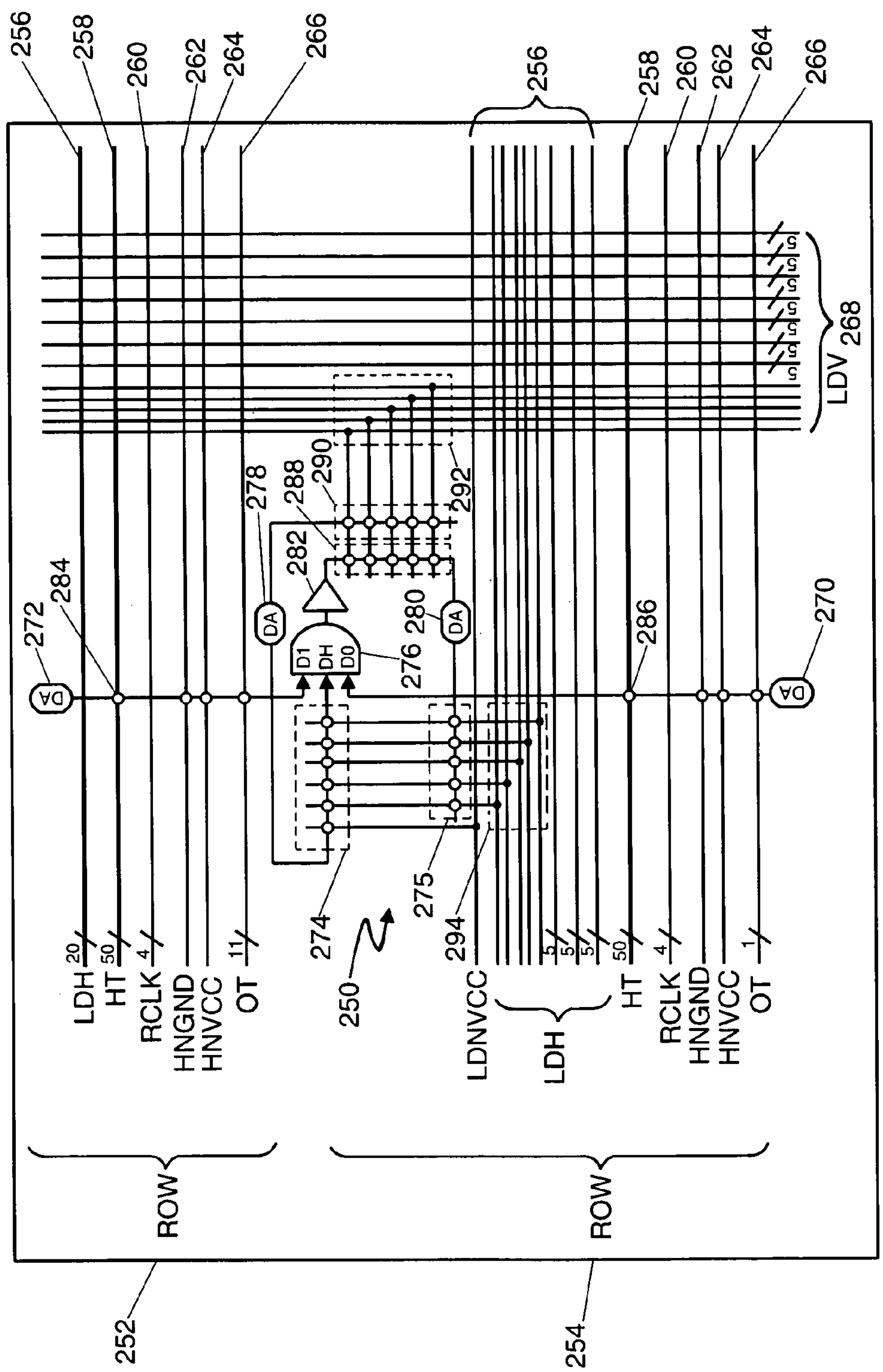
FIG. 5 is a simplified schematic diagram of a transmitter module (TX) in a logic cluster as shown in FIG. 3.

FIG. 5 is a simplified schematic diagram of a transmitter module (TX) as shown in FIG. 3. Transmitter module 250 provides transmission capability to second-level horizontal channels 256 and second-level vertical channels 268. Transmitter module 250 comprises a three-input AND gate 276. One input of three-input AND gate 276 is coupled to first-level horizontal channel 258 in the same row 254 as transmitter module 250 and another input of three-input AND gate is coupled to first-level horizontal channel 258 in the row 252 above transmitter module 250. Therefore, transmitter module 250 may receive a signal from first-level horizontal channel 258 in the same row as transmitter module 250 or from the row above by programming one of either programmable elements 284 or 286. The third input of three-input AND gate 276 may be coupled to either second-level horizontal channel 256 in row 254 or second-level vertical channel 268. Three-input AND gate has an output coupled to an input of buffer 282. Buffer 282 has an output coupled to either second-level vertical channel through programmable elements 288 and 290 or to second-level horizontal channel in row 254 through programmable elements 282 and 275. As those of ordinary skill in the art having the benefit of this disclosure will recognize, direct address devices 270, 272, 278 and 280 are employed to program the respective programmable elements.

As stated above, transmitter module 250 may receive a signal from first-level horizontal channel 258 in the same row as transmitter module 250 or from the row above by programming either programmable elements 284 or 286. In one illustrative example, if programmable element 284 is programmed to receive a signal from first-level horizontal channel 258, programmable element 286 is left unprogrammed and is either coupled to Vcc or ground through track 264 and 362 respectively in row 254. The signal is received through a first input of three-input AND gate 276. The second and third inputs of three-input AND gate 276 are tied to Vcc. The signal received from horizontal channel 258 in row 252 is then passed through buffer 282 and either routed to a second-level vertical channel 268 through programmable elements 288 and 290 or to a second-level horizontal channel 256 in row 254 through programmable elements 288 and 275. Thus, transmitter module 250 is programmably couplable to second-level vertical tracks 268 at intersection 292 through programmable elements 290 and programmably couplable to second-level horizontal tracks at intersection 294 through programmable elements 275. As one of ordinary skill in the art having the benefit of this disclosure will recognize, not all programmable elements in groups 288, 290, 275 and 294 will be programmed at once. This example is illustrative only, the actual circuit programmed through the programmable elements will depend on the user circuit mapped into the FPGA core.

Transmitter module 250 may also transfer a signal between second-level vertical channel 268 and second-level horizontal channel 256 in the same row 254 as transmitter module 250 and vice versa. For example, if a signal travels between second-level vertical channel 268 and second-level horizontal channel 256, one of programmable elements 290 is programmed and one of programmable elements 274 is programmed and fed through a second input of three-input AND gate 276. The other two inputs of three-input AND gate are tied to Vcc via track 264. The signal from second-level vertical channel travels through three-input AND gate 276 through buffer 282 and is transferred to second-level horizontal channel through one of programmable elements 288 and one of programmable elements 275.

As is clearly illustrated in FIG. 5, the coupling between transmitter module 250 and only one channel (5 tracks) in each second-level vertical channel 268 and second-level horizontal channel is shown. The representation shown is illustrative of all connections between all eight channels in second-level vertical channel 268 and all four channels in second-level horizontal channel 256.

Figure 6:
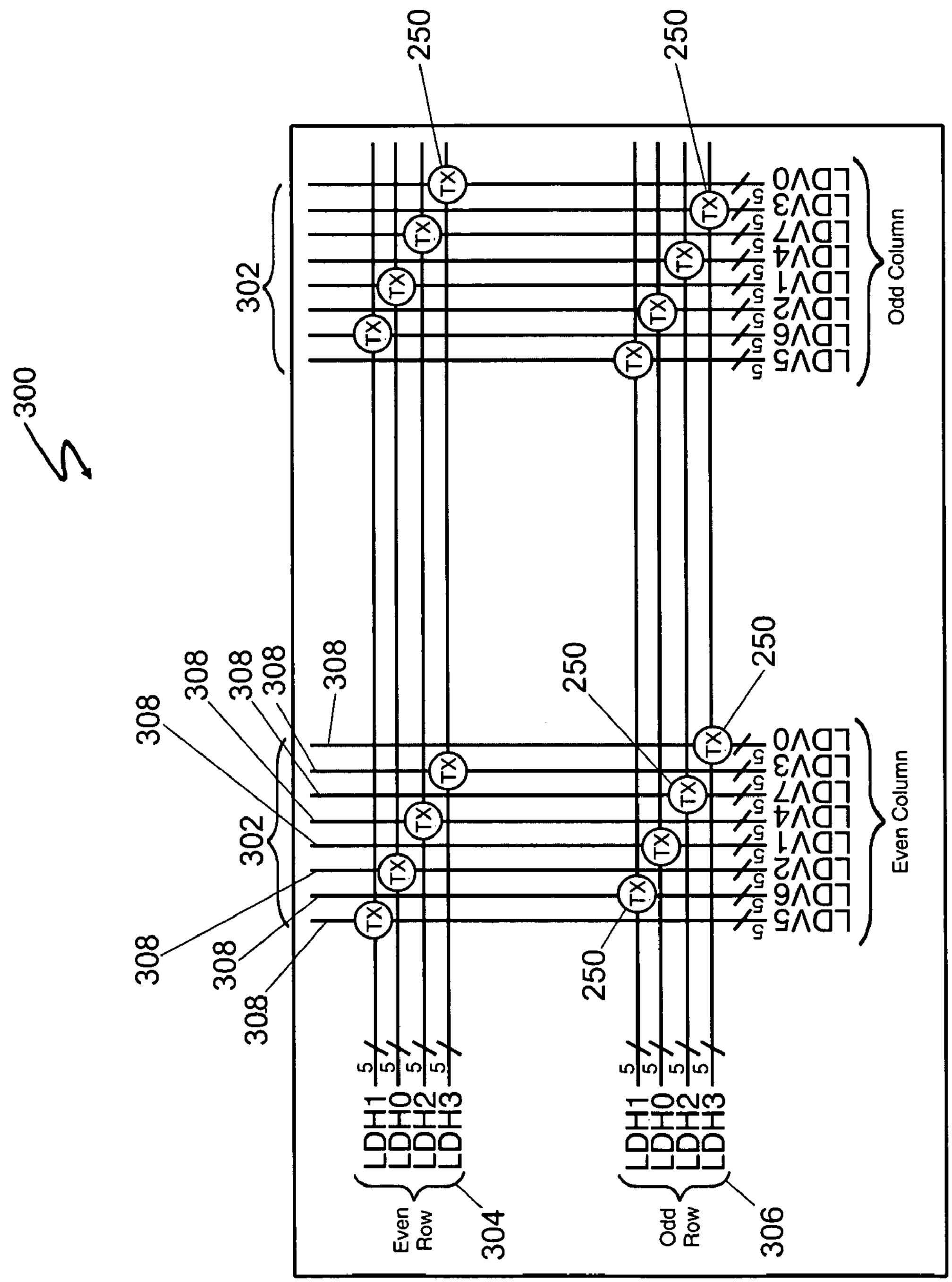
FIG. 6 is a simplified schematic diagram illustrating the TX module patterns between two logic cluster rows and two logic cluster columns.

FIG. 6 is a simplified schematic diagram illustrating the TX module patterns between two logic cluster rows and two logic cluster columns. TX modules 250 are coupled to every other second-level vertical channel 308 within the same logic cluster column 302. The second-level vertical channel alternates over odd and even rows as illustrated in FIG. 6. A pattern such as described in the present invention allows for a more flexible routing structure and provides improved signal coverage throughout the FPGA. For example, all eight second level vertical channels have equal access to first level channels every two rows. In addition, any second level horizontal channel has access to any second level vertical channel and vise versa. The pattern allows the transfer of signals from all channels to all other channels in a vertical or horizontal direction.

Figure 7:
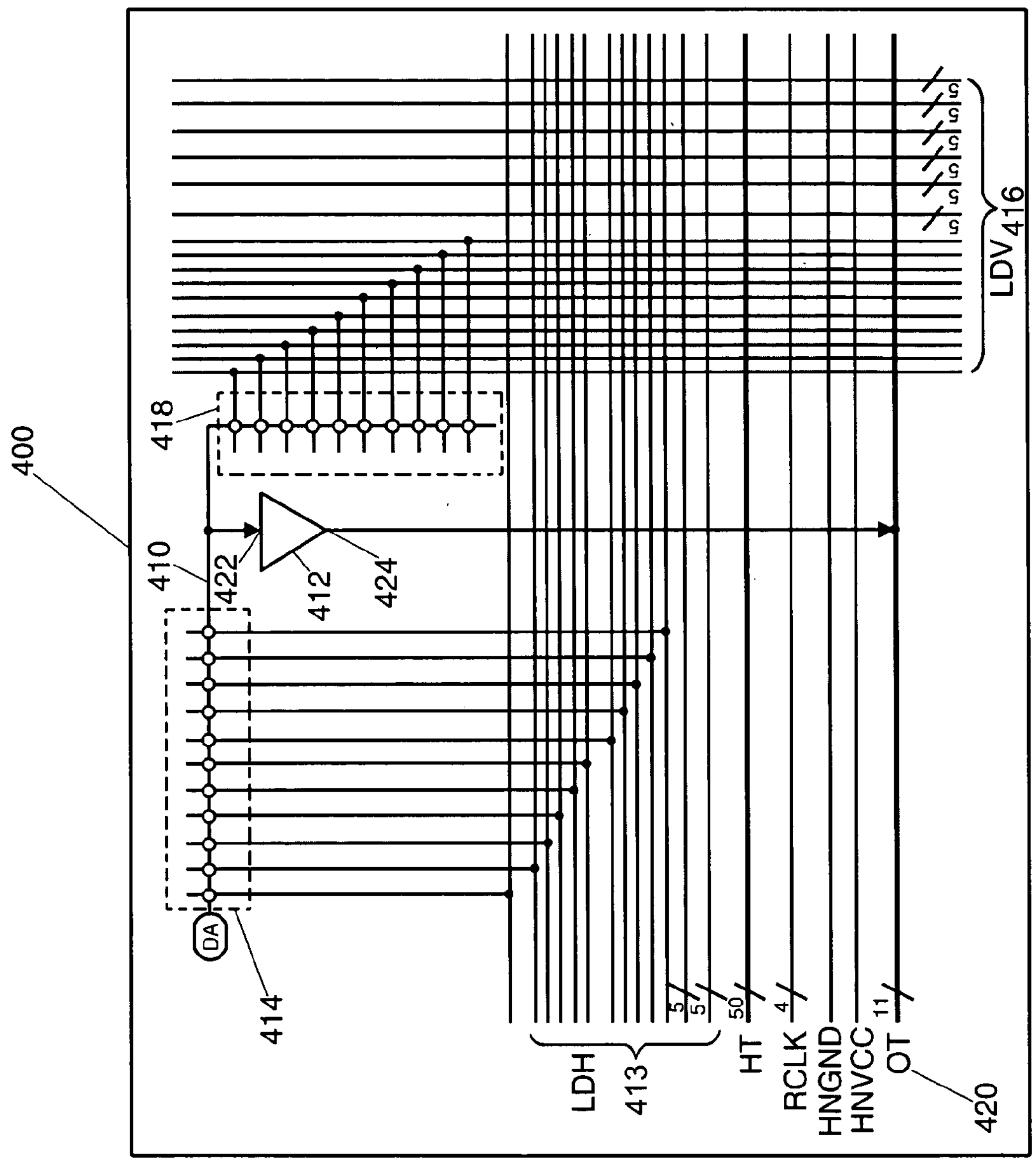
FIG. 7 is a simplified schematic diagram of a receiver module (RX) in a logic cluster as shown in FIG. 3.

FIG. 7 is a simplified schematic diagram of the interconnect architecture 400 of a receiver module (RX) 410 as shown in FIG. 3. Receiver module 410 comprises a buffer 412. Buffer 412 has an input 422 coupled to one of either second-level horizontal channel 413 through programmable elements 414 in the same row as RX 410 or second-level vertical channel 416 through programmable elements 418 in same logic cluster column RX 410. Buffer 412 has an output 424 coupled to its own output track 420. Output track 420 is coupled to the first-level routing architecture. Therefore, RX module 410 receives a signal from the second level routing architecture and transfers the signal back into the first-level routing architecture. As one of ordinary skill in the art having the benefit of this disclosure will recognize, not all programmable elements in groups 414 and 418 will be programmed at once. This example is illustrative only, the actual circuit programmed through the programmable elements will depend on the user circuit mapped into the FPGA core.

As is clearly illustrated in FIG. 7, the coupling between receiver module 410 and one channel (a set of five tracks) in each second-level vertical channel 416 and second-level horizontal channel 413 is shown. The representation shown is illustrative of all connections between all eight second-level vertical channels 416 and all four second-level horizontal channels 413.

Figure 8:
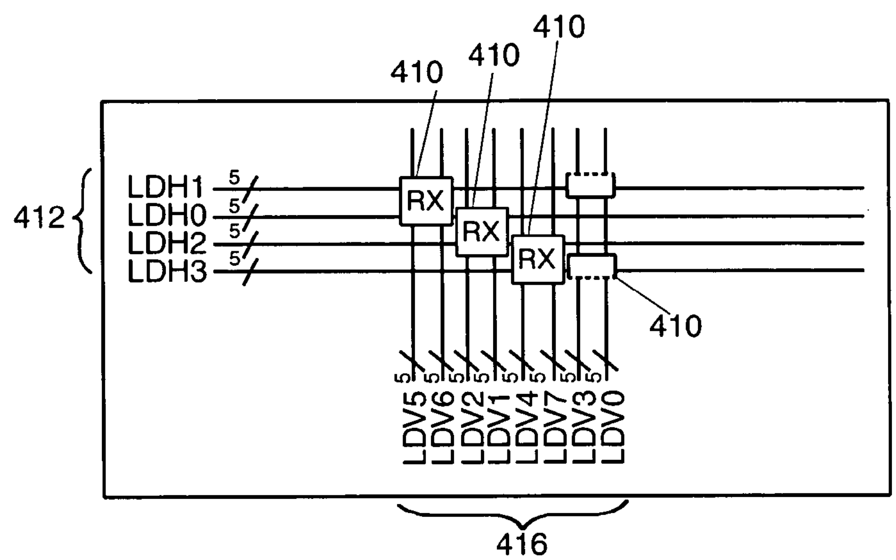
FIG. 8 is a simplified schematic diagram illustrating the RX module patterns between two logic cluster rows and two logic cluster columns.

FIG. 8 is a simplified schematic diagram illustrating the receiver module patterns between two logic cluster rows and two logic cluster columns as illustrated in FIG. 1. Each receiver module 410 is coupled to two second-level vertical channels 416 and two second-level horizontal channels 412 in the same logic cluster column. A pattern such as described in the present invention allows for a more flexible routing structure and provides improved signal coverage throughout the FPGA. For example, the receiver module 410 patterns between two logic cluster rows and two logic cluster columns allows for every vertical channel to transfer signals to two horizontal channels. The overlap pattern illustrated in FIG. 8 allows for greater flexibility in the device. For instance, every vertical channel can turn into two horizontal channels as stated above and receiver module 410 can transfer a signal down to a first level routing channel from any two horizontal channels and any two vertical channels. Thus, there is double coverage on horizontal channels.

Figure 9:
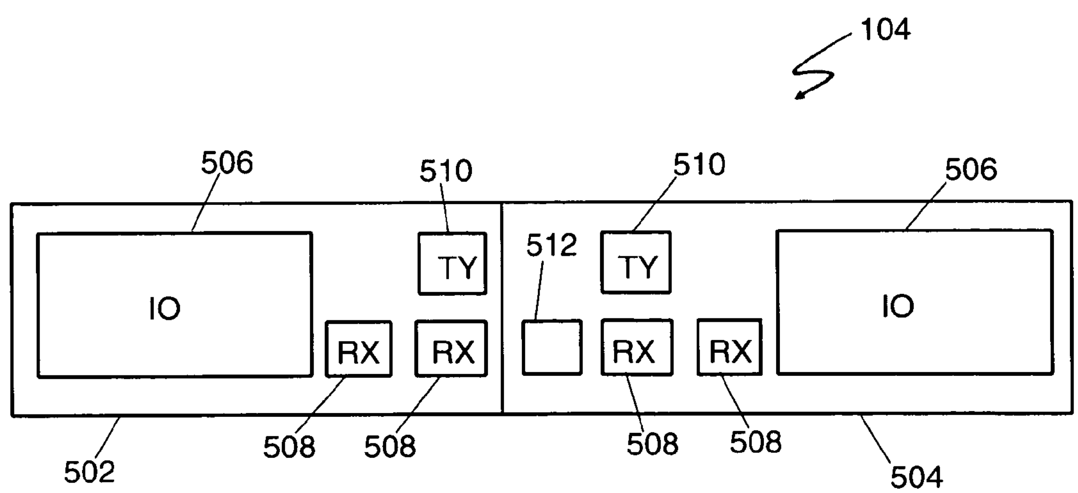
FIG. 9 is a simplified block diagram of an input/output (I/O) cluster of the present invention.

FIG. 9 is a simplified block diagram of an input/output (I/O) cluster of FIGS. 1 and 2. I/O cluster 104 comprises two sub-clusters 502 and 504. Sub-cluster 502 includes an input/output module 506, two receiver modules 508 and transmitter module 510. Sub-cluster 504 includes an input/output module 506, two receiver modules 508, transmitter module 510 and a buffer module 512. Receiver module 508 in I/O cluster 104 is identical to receiver module 410 illustrated in FIG. 7 above.

To avoid overcomplicating the disclosure and thereby obscuring the present invention buffer module 512 is not described in detail herein. The implementation of buffer module 512 suitable for use according to the present system is disclosed in U.S. patent application Ser. No. 10/293,895, filed Nov. 12, 2002, by inventor William C. Plants, entitled "BUFFER MODULE AND A METHOD OF DISTRIBUTING BUFFER MODULES IN AN ANTIFUSE FPGA", and hereby incorporated herein by reference.

Figure 10:
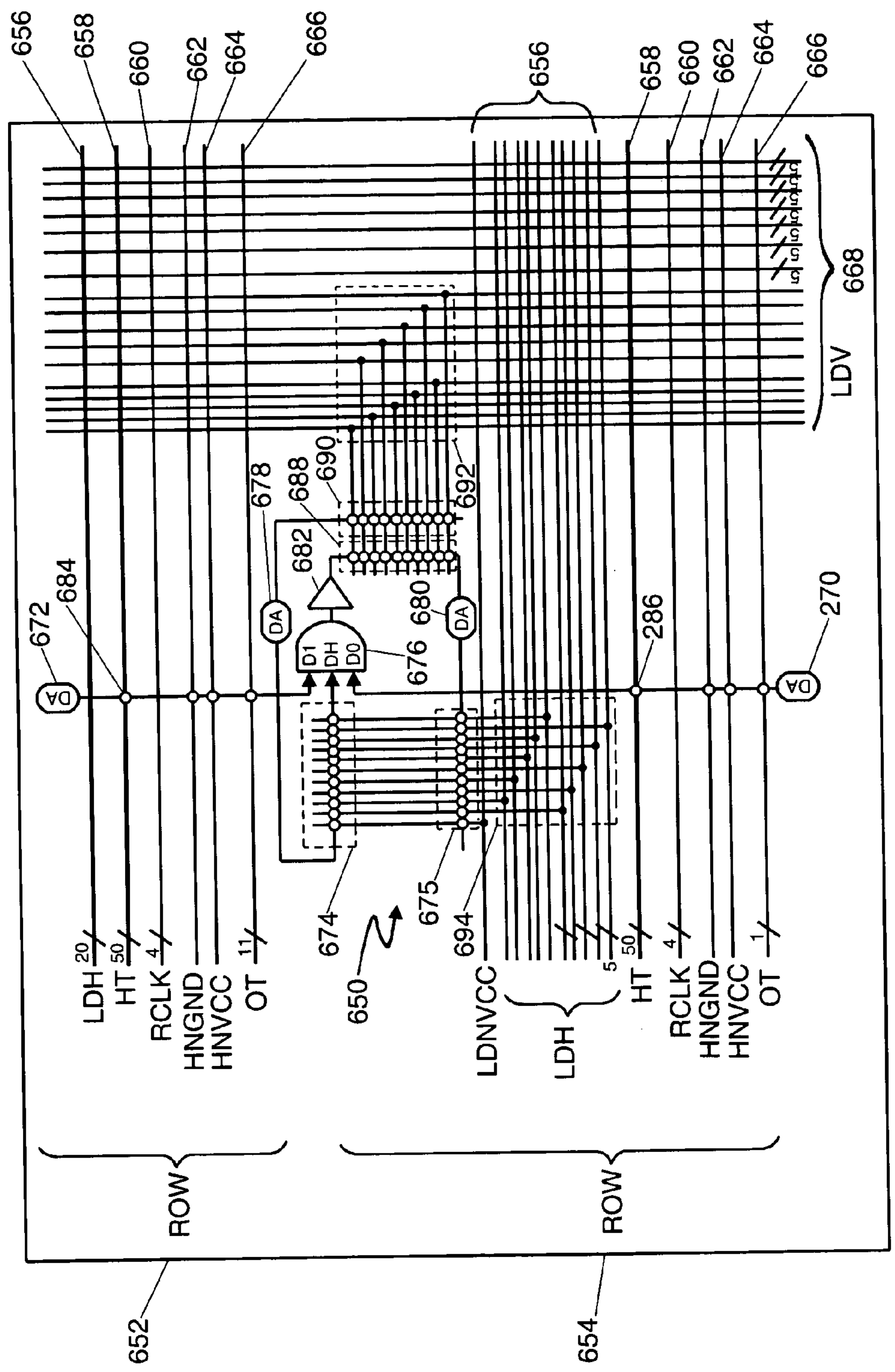
FIG. 10 is a simplified schematic diagram of an I/O cluster transmitter (TY) module in a input/output cluster as shown in FIG. 9.

FIG. 10 is a simplified schematic diagram of an I/O cluster transmitter (TY) module of the I/O cluster 104 of FIG. 9. TY module 650 is identical to transmitter (TX) module 250 of FIG. 5 except that TY module 650 has access to two second-level vertical channels 668 and two second-level horizontal channels 656 in the same row 654.

Transmitter module 650 provides transmission capability to second-level horizontal channels 656 and second-level vertical channels 668. Transmitter module 650 comprises a three-input AND gate 676. One input of transmitter module is coupled to first-level horizontal channel 658 in the same row as transmitter module 650 and another input of three-input AND gate is coupled to first-level horizontal channel 658 in the row above transmitter module 650. Therefore, transmitter module 650 may receive a signal from first-level horizontal channel 658 in the same row as transmitter module 650 or from the row above by programming either programmable elements 684 or 686. The third input of three-input AND gate 676 may be coupled to either second-level horizontal channel 656 in row 654 or second-level vertical channel 668. Three-input AND gate has an output coupled to an input of buffer 682. Buffer 682 has an output coupled to either second-level vertical channel through programmable elements 688 and 690 or to second-level horizontal channel in row 654 through programmable elements 682 and 675. As those of ordinary skill in the art having the benefit of this disclosure will recognize, direct address devices 670, 672, 678 and 680 are employed to program the respective programmable elements.

As stated above, transmitter module 650 may receive a signal from first-level horizontal channel 658 in the same row as transmitter module 650 or from the row above by programming either programmable elements 684 or 686. In one illustrative example, if programmable element 684 is programmed to receive a signal from first-level horizontal channel 658, programmable element 686 is left unprogrammed and is either coupled to Vcc or ground through tracks 664 or 662 respectively in row 654. The signal is received through a first input of three-input AND gate 676. The second and third inputs of three-input AND gate 676 are tied to either Vcc or ground. The signal received from horizontal channel 658 in row 652 is then transmitted through buffer 682 and either routed to a two channels in second-level vertical channel 668 through programmable elements 688 and 690 or to two channels in second-level horizontal channel 656 in row 654 through programmable elements 688 and 675. Thus, transmitter module 650 is programmably couplable to second-level vertical tracks 668 at intersection 692 through programmable elements 690 and programmably couplable to second-level horizontal tracks at intersection 694 through programmable elements 675. As one of ordinary skill in the art having the benefit of this disclosure will recognize, not all programmable elements in groups 688, 690, 675 and 694 will be programmed at once. This example is illustrative only, the actual circuit programmed through the programmable elements will depend on the user circuit mapped into the FPGA core.

Transmitter module 650 may also transfer a signal from one of two channels in second-level vertical channel 668 to one of two channels in second-level horizontal channel 656 in the same row 654 as transmitter module 650 and vice versa. For example, if a signal travels from second-level vertical channel 668 to second-level horizontal channel 656, one of programmable elements 690 is programmed and one of programmable elements 674 is programmed and fed through a second input of three-input AND gate 676. The other two inputs of three-input AND gate are tied to either Vcc or ground via track 662 and 664. The signal from second-level vertical channel travels through three-input AND gate 676 through buffer 682 and is transferred to second-level horizontal channel through one of programmable elements 688 and one of programmable elements 675.

As is clearly illustrated in FIG. 10, only one example of possible combinations of coupling choices between transmitter module 650 and two channels in second-level vertical channel 268 and two channels in second-level horizontal channel is shown. The representation shown is illustrative of all connections between all eight channels in second-level vertical channel 668 and all four channels in second-level horizontal channel 656.

Figure 11:
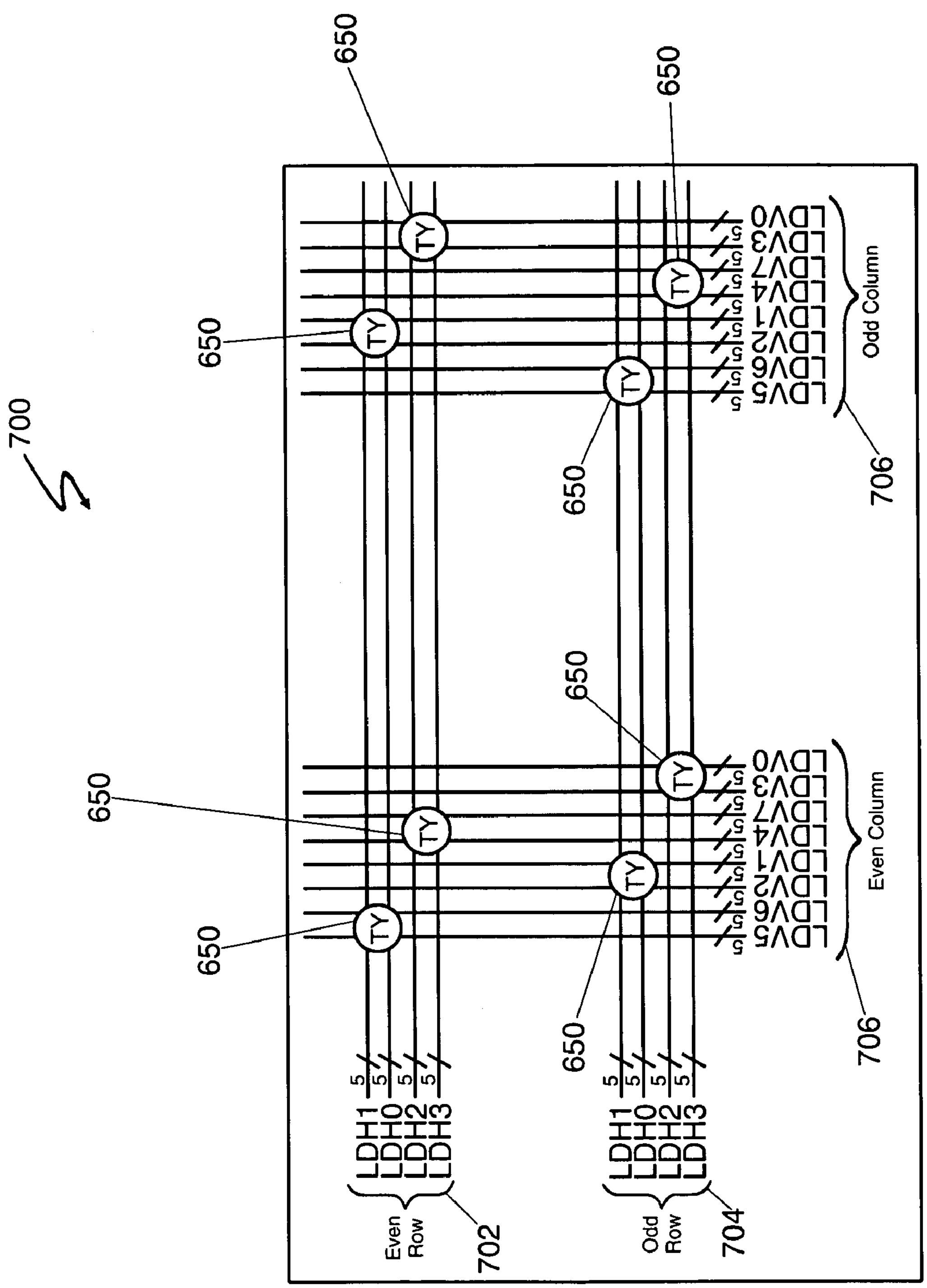
FIG. 11 is a simplified schematic diagram illustrating the I/O cluster TY module patterns between two logic cluster rows and two logic cluster columns.

FIG. 11 is a simplified schematic diagram illustrating the I/O cluster transmitter module 650 patterns between two logic cluster rows and two logic cluster columns. Transmitter modules 650 are coupled to every two second-level horizontal channels 702 within the same logic cluster column 302. The second-level vertical channel alternates over odd and even columns as illustrated in FIG. 11.

It should be understood that various alternatives to the embodiments of the disclosed method and apparatus descried herein maybe employed in practicing the disclosed method and using the disclosed apparatus. It is intended that the following claims define the scope of the disclosed method and apparatus and that methods and structures within the scope of these claims and their equivalents be covered thereby.

What is claimed is:

1. A field programmable gate array (FPGA) comprising:

a plurality of logic clusters arranged in rows and columns, each logic cluster comprising a plurality of receiver modules, a plurality of transmitter modules, at least one buffer module, at least one sequential logic component, and a first combinatorial logic component;

a first-level routing architecture programmably coupled to said plurality of logic clusters;

a second-level routing architecture programmably coupled to said first-level routing architecture through at least one of said plurality of transmitter modules and at least one of said plurality of receiver modules; and wherein at least one of said plurality of receiver modules comprises a buffer having an input coupled to said second-level routing architecture and an output coupled to an output track in said first-level routing architecture, and at least one of said plurality of receiver modules can receive signals from said second-level routing architecture to said first-level routing architecture.

2. The FPGA of claim 1 wherein at least one of said plurality of transmitter modules comprises:

an AND gate having three inputs and an output, wherein at least one of said inputs is coupled to said first-level routing architecture and one of said inputs is coupled to said second-level routing architecture;

a buffer module having an input coupled to said output of said AND gate and an output coupled to said second-level routing architecture; and wherein at least one of said plurality of transmitter modules can transmit signals from said first-level routing architecture to said second-level routing architecture and can transmit signals from a vertical channel of said second-level routing architecture to a plurality of horizontal channels of said second-level routing architecture.

3. A routing architecture in a field programmable gate array (FPGA) comprising:

a plurality of input/output (I/O) clusters, said I/O clusters comprising a plurality of receiver modules, a plurality of transmitter modules, at least one buffer module, and an I/O component;

a first-level routing architecture programmably coupled to at least one of said plurality of I/O clusters; and a second-level routing architecture programmably coupled to at least one of said plurality of I/O clusters and to said first-level routing architecture through at least one of said plurality of transmitter modules and at least one of said plurality of receiver modules.

4. The FPGA of claim 3 wherein at least one of said plurality of transmitter modules further comprises:

an AND gate having three inputs and an output, wherein at least one of said inputs is coupled to said first-level routing architecture and one of said inputs is coupled to said second-level routing architecture;

a buffer module having an input coupled to said output of said AND gate and an output coupled to said second-level routing architecture; and wherein at least one of said plurality of transmitter modules can transmit all signals from said first-level routing architecture to said second-level routing architecture and transfer signals from all second-level vertical channels to two second-level horizontal channels.

5. The FPGA of claim 3 wherein at least one of said plurality of receiver modules further comprises:

a buffer having an input coupled to said second-level routing architecture and an output coupled to an output track in said first-level routing architecture; and wherein at least one of said plurality of receiver modules can receive all signals from said second-level horizontal and vertical routing architecture to said first-level routing architecture.

6. A method of forming a routing architecture in a field programmable gate array (FPGA) comprising:

providing a plurality of logic clusters arranged in rows and columns, each logic cluster comprising a plurality of receiver modules, a plurality of transmitter modules, at least one buffer module, at least one sequential logic component, and a first combinatorial logic component;

programmably coupling a first-level routing architecture to said logic clusters;

programmably coupling a second-level routing architecture to said first-level routing architecture through at least one of said plurality of transmitter modules and at least one of said plurality of receiver modules; and wherein at least one of said plurality of receiver modules comprises a buffer having an input coupled to said second-level routing architecture and an output coupled to an output track in said first-level routing architecture, and at least one of said plurality of receiver modules can receive signals from a vertical channel and a horizontal channel in said second-level routing architecture and can transmit said signals to said first-level routing architecture.

7. The method of claim 6 wherein at least one of said plurality of transmitter modules comprises:

an AND gate having three inputs and an output, wherein at least one of said inputs is coupled to said first-level routing architecture and at least one of said inputs is coupled to said second-level routing architecture;

a buffer module having an input coupled to said output of said AND gate and an output coupled to said second-level routing architecture; and wherein at least one of said plurality of transmitter modules can transmit signals from said first-level routing architecture to said second-level routing architecture and can transmit signals from vertical channels to a plurality of horizontal channels of said second-level routing architecture.

8. A method of forming a routing architecture in a field programmable gate array (FPGA) comprising:

providing a plurality of input/output (I/O) clusters, said I/O clusters comprising a plurality of receiver modules, a plurality of transmitter modules, at least one buffer module, and an I/O component;

programmably coupling a first-level routing architecture to at least one of said plurality of I/O clusters; and programmably coupling a second-level routing architecture to at least one of said plurality of I/O clusters and to said first-level routing architecture through at least one of said plurality of transmitter modules and at least one of plurality of receiver modules.

9. The method of claim 8 wherein at least one of said plurality of transmitter modules further comprises:

an AND gate having three inputs and an output, wherein at least one of said inputs is coupled to said first-level routing architecture and at least one of said inputs is coupled to said second-level routing architecture;

a buffer module having an input coupled to said output of said AND gate and an output coupled to said second-level routing architecture; and wherein at least one of said plurality of transmitter modules can transmit signals from said first-level routing architecture to said second-level routing architecture and can transmit signals between a vertical channel of said second-level routing architecture to a plurality of horizontal channels of second-level routing architecture.

10. The method of claim 8 wherein at least one of said plurality of receiver modules further comprises:

a buffer having an input coupled to said second-level routing architecture and an output coupled to an output track in said first-level routing architecture; and wherein at least one of said plurality of receiver modules can receive signals from a vertical channel in said second-level routing architecture and a horizontal channel in said second-level routing architecture and can transmit said signals to said first-level routing architecture.

11. In a field programmable gate array (FPGA) comprising a plurality of logic clusters arranged in rows and columns, each of said plurality of logic clusters comprising:

a plurality of receiver modules, a plurality of transmitter modules, at least one buffer module, at least one sequential logic component, and a first combinatorial logic component, and a method of routing a signal between a first-level routing architecture and a second-level routing architecture comprising:

programming a first programmable element to couple at least one of a plurality of routing tracks in said first-level routing architecture to at least one of said plurality of transmitter modules of said logic cluster;

programming a second programmable element to couple at least one of said plurality of transmitter modules to at least one of a plurality of tracks of said second-level routing architecture; and sending the signal from said at least one of a plurality of tracks of the first-level routing architecture to at least one of a plurality of tracks of the second-level routing architecture.

12. The method of claim 11, wherein said programming said first programmable element and said programming said second programmable element comprises programming at least one antifuse.

13. A field programmable gate array (FPGA) comprising:

a plurality of logic clusters arranged in rows and columns, each logic cluster comprising a plurality of receiver modules, a plurality of transmitter modules, at least one buffer module, at least one sequential logic component, and a first combinatorial logic component;

a first-level routing architecture programmably coupled to said plurality of logic clusters;

a second-level routing architecture programmably coupled to said first-level routing architecture through at least one of said plurality of transmitter modules and at least one of said plurality of receiver modules; and wherein at least one of said plurality of transmitter modules comprises:

an AND gate having three inputs and an output, wherein at least one of said inputs is coupled to said first-level routing architecture and one of said inputs is coupled to said second-level routing architecture;

a buffer module having an input coupled to said output of said AND gate and an output coupled to said second-level routing architecture; and wherein at least one of said plurality of transmitter modules can transmit signals from said first-level routing architecture to said second-level routing architecture and can transmit signals from a vertical channel of said second-level routing architecture to a plurality of horizontal channels of said second-level routing architecture.

14. The FPGA of claim 13, wherein at least one of said plurality of receiver modules comprises:

a buffer having an input coupled to said second-level routing architecture and an output coupled to an output track in said first-level routing architecture; and wherein at least one of said plurality of receiver modules can receive signals from said second-level routing architecture to said first-level routing architecture.

15. A method of forming a routing architecture in a field programmable gate array (FPGA) comprising:

providing a plurality of logic clusters arranged in rows and columns, each logic cluster comprising a plurality of receiver modules, a plurality of transmitter modules, at least one buffer module, at least one sequential logic component, and a first combinatorial logic component;

programmably coupling a first-level routing architecture to said logic clusters;

programmably coupling a second-level routing architecture to said first-level routing architecture through at least one of said plurality of transmitter modules and at least one of said plurality of receiver modules; and wherein at least one of said plurality of transmitter modules comprises:

an AND gate having three inputs and an output, wherein at least one of said inputs is coupled to said first-level routing architecture and at least one of said inputs is coupled to said second-level routing architecture;

a buffer module having an input coupled to said output of said AND gate and an output coupled to said second-level routing architecture; and wherein at least one of said plurality of transmitter modules can transmit signals from said first-level routing architecture to said second-level routing architecture and can transmit signals from vertical channels to a plurality of horizontal channels of said second-level routing architecture.

16. The method of claim 15, wherein at least one of said plurality of receiver modules comprises:

a buffer having an input coupled to said second-level routing architecture and an output coupled to an output track in said first-level routing architecture; and wherein at least one of said plurality of receiver modules can receive signals from a vertical channel and a horizontal channel in said second-level routing architecture and can transmit said signals to said first-level routing architecture.

* * * * *